United States Patent
Winstead et al.

(10) Patent No.: US 8,724,399 B2
(45) Date of Patent: May 13, 2014

(54) METHODS AND SYSTEMS FOR ERASE BIASING OF SPLIT-GATE NON-VOLATILE MEMORY CELLS

(75) Inventors: Brian A. Winstead, Austin, TX (US); Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 221 days.

(21) Appl. No.: 13/451,876

(22) Filed: Apr. 20, 2012

(65) Prior Publication Data

US 2013/0279267 A1   Oct. 24, 2013

(51) Int. Cl.
*G11C 16/04* (2006.01)

(52) U.S. Cl.
USPC ................................... 365/185.29

(58) Field of Classification Search
None
See application file for complete search history.

(56) References Cited

U.S. PATENT DOCUMENTS

| | | | |
|---|---|---|---|
| 5,706,228 A | 1/1998 | Chang et al. | 365/185.18 |
| 6,493,262 B1 | 12/2002 | Wald et al. | 365/182.15 |
| 7,057,230 B2 | 6/2006 | Tanaka et al. | 257/315 |
| 7,704,830 B2 | 4/2010 | Rao et al. | 438/257 |
| 7,985,649 B1 | 7/2011 | Winstead et al. | 438/260 |
| 2008/0290401 A1* | 11/2008 | Yasui et al. | 257/324 |

OTHER PUBLICATIONS

Prinz, Erwin J., "*The Zen of Nonvolatile Memories*," Freescale Semiconductor, Inc., 47.3, pp. 815-820 (Jul. 2006).

* cited by examiner

*Primary Examiner* — Huan Hoang
*Assistant Examiner* — James G Norman
(74) *Attorney, Agent, or Firm* — Egan, Peterman & Enders LLP.

(57) ABSTRACT

Methods and systems are disclosed for erasing split-gate non-volatile memory (NVM) cells using select-gate erase voltages that are adjusted to reduce select-gate to control-gate breakdown failures. The adjusted select-gate erase voltages provide bias voltages on the select-gates that are configured to have the same polarity as the control-gate erase voltages applied during erase operations and that are different from select-gate read voltages applied during read operations. Certain additional embodiments use discrete charge storage layers for the split-gate NVM cells and include split-gate NVM cells having gap dielectric layer thicknesses that are dependent upon control gate dielectric layer widths.

20 Claims, 6 Drawing Sheets

| + BIAS | $V_D$ | $V_{SG}$ | $V_{CG}$ | $V_S$ |
|---|---|---|---|---|
| READ | 0.5 | $V_R$ | $V_R$ | 0 |
| ERASE | 0 | $V_R$ | $V_E$ | 0 |

FIG. 2
- PRIOR ART -

| - BIAS | $V_D$ | $V_{SG}$ | $V_{CG}$ | $V_S$ |
|---|---|---|---|---|
| READ | 0.5 | $V_R$ | $V_R$ | 0 |
| ERASE | 0 | 0 | $-V_E$ | 0 |

FIG. 3
- PRIOR ART - though other memory cell types could also be utilized, if desired. Different features and variations can be implemented, as desired, and related or modified systems and methods can be utilized, as well.

METHODS AND SYSTEMS FOR ERASE BIASING OF SPLIT-GATE NON-VOLATILE MEMORY CELLS

TECHNICAL FIELD

This technical field relates to split-gate non-volatile memories (NVMs) and, more particularly, to techniques for erasing split-gate NVM cells.

BACKGROUND

Prior programmable memories have been implemented using split-gate non-volatile memory (NVM) cells. These programmable memories can be implemented as stand-alone memory integrated circuits or can be embedded within other integrated circuits, as desired.

FIG. 1 (Prior Art) is a diagram of an embodiment for a split-gate non-volatile memory (NVM) cell 100. As depicted, the split-gate NVM cell 100 includes a semiconductor substrate 112, a drain 136, a source 138, a lightly doped channel region 126, a select gate 116 and a control gate 134. Layer 114 is a select-gate dielectric layer. Layer 128 is a control-gate dielectric layer and also provides a gap dielectric layer between the select gate 116 and the control gate 134. Layer 118 is an antireflective coating (ARC). And layer 132 is a discrete charge storage layer for the split-gate memory cell.

FIG. 2 (Prior Art) is a voltage control diagram 200 for read and erase operations for the split-gate NVM cell 100 using positive bias (+BIAS). During a read operation, the drain voltage ($V_D$) is set to 0.5 volts, and the source voltage ($V_S$) is set to 0 volts, which can represent ground for the integrated circuit within which the split-gate NVM cell 100 is integrated. Also during a read operation, the select-gate voltage ($V_{SG}$) and the control-gate voltage ($V_{CG}$) are set to a selected read voltage level ($V_R$), which can be, for example, the supply voltage ($V_{DD}$) for the integrated circuit within which the split-gate NVM cell 100 is integrated. During an erase operation, the drain voltage ($V_D$) and the source voltage ($V_S$) are set to 0 volts. Also during an erase operation, the select-gate voltage ($V_{SG}$) is typically set to the read voltage level ($V_R$) or to 0 volts (e.g., ground) as convenient and available voltages, and the control-gate voltage ($V_{CG}$) is set to a positive erase voltage ($V_E$), which is a large positive voltage used to remove charge from the discrete charge storage layer 132 for the erase operation. As one example, it is noted that 1.2 volts can be selected for the read voltage level ($V_R$), and 14 volts can be selected for the erase voltage ($V_E$).

FIG. 3 (Prior Art) is a voltage control diagram 300 for read and erase operations for the split-gate NVM cell 100 using negative bias (−BIAS). During a read operation, the drain voltage ($V_D$) is set to 0.5 volts, and the source voltage ($V_S$) is set to 0 volts. Also during a read operation, the select-gate voltage ($V_{SG}$) and the control-gate voltage ($V_{CG}$) are set to a selected read voltage level ($V_R$). During an erase operation, the drain voltage ($V_D$) and the source voltage ($V_S$) are set to 0 volts. Also during an erase operation, the select-gate voltage ($V_{SG}$) is typically set to 0 volts (e.g., ground) or to the read voltage level ($V_R$) as convenient and available voltages, and the control-gate voltage ($V_{CG}$) is set to a negative erase voltage ($-V_E$), which is a large negative voltage used to remove charge from the discrete charge storage layer 132 for the erase operation. As one example, it is noted that 1.2 volts can be selected for the read voltage level ($V_R$), and −14 volts can be selected for the erase voltage ($-V_E$).

During erase operations for an array of split-gate NVM cells 100, select-gate to control-gate break-down failures can occur. One prior solution to reduce these break-down failures is to increase the thickness of the gap dielectric layer between the control gate 134 and the select gate 116. Controlling this gap thickness, however, can be difficult for some split-gate NVM cell processes. For example, the dielectric layer 128 in FIG. 1 (Prior Art) provides an insulated gap between the control gate 134 and the select gate 116 and provides the control gate dielectric layer between the control gate 134 and the lightly doped channel region 126. As this dielectric layer 128 is formed in one or more common processing steps, the gap thickness will be determined by the control gate stack requirements and is not easily adjusted without adversely affecting the operation of the gate stack. One prior solution to this gate stack requirement is to add an additional processing step to add a gap spacer oxide layer between the select gate 116 and the control gate 134 prior to formation of the control gate dielectric layer 128.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a diagram of an embodiment for a split-gate non-volatile memory (NVM) cell.

FIG. 2 (Prior Art) is a voltage control diagram for read and erase operations for a split-gate NVM cell using positive bias (+BIAS).

FIG. 3 (Prior Art) is a voltage control diagram for read and erase operations for a split-gate NVM cell using negative bias (−BIAS).

DETAILED DESCRIPTION

Methods and systems are disclosed for erase biasing of split-gate non-volatile memory (NVM) cells using select-gate erase voltages that are adjusted to reduce select-gate to control-gate break-down failures. The select-gate erase voltages are adjusted to provide select-gate bias voltages that have the same polarity as the control-gate voltages applied during erase operations. Additional embodiments include split-gate NVM cells using discrete charge storage layers, such as silicon nanocrystals, for the split-gate NVM cells. Other additional embodiments include NVM cells where the thickness of gap layers between select gates and control gates is tied to the thickness of control gate dielectric layers. The described embodiments provide efficient and cost effective solutions for reducing select-gate to control-gate break-down failures. As described herein, different features and variations can be implemented, as desired, and related or modified systems and method can be utilized, as well.

Figure 1:
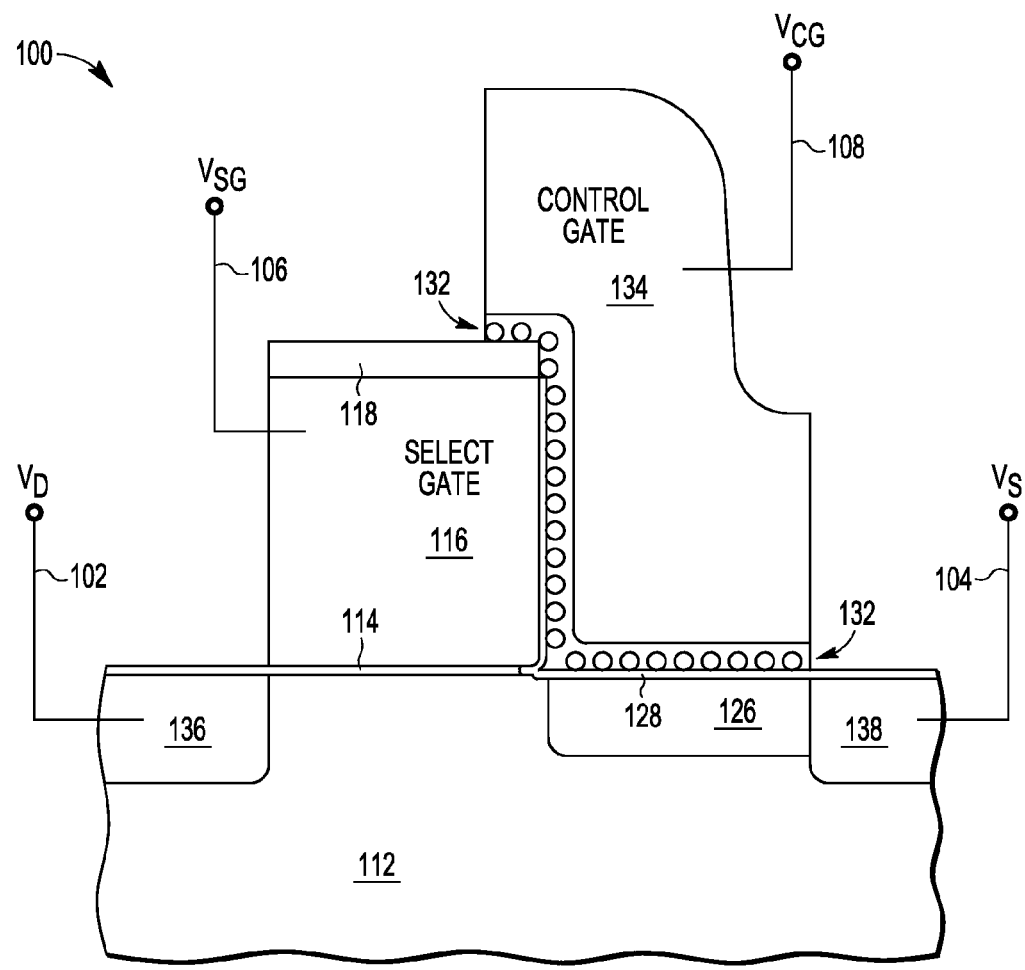
Figure 4:
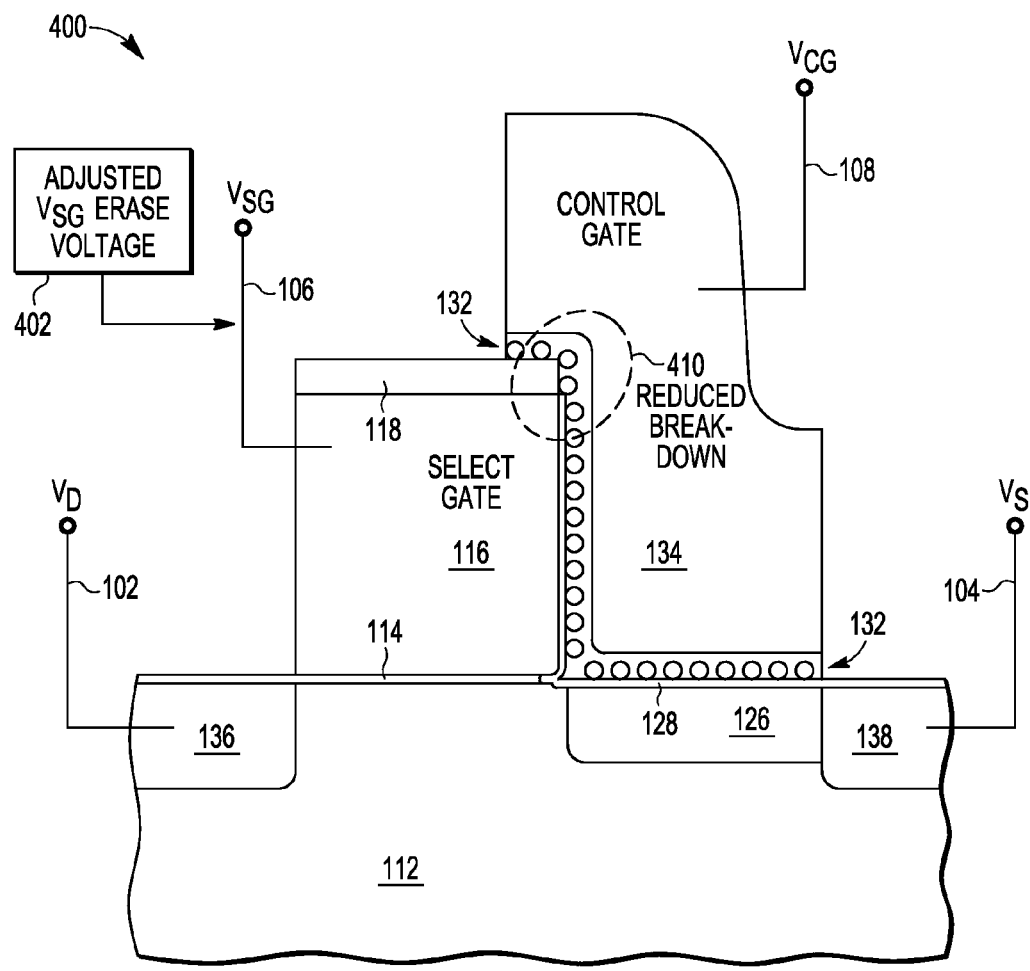
FIG. 4 is a diagram of an embodiment for a split-gate non-volatile memory (NVM) cell using an adjusted select-gate erase voltage to reduce break-down failures.

FIG. 4 is a diagram of an embodiment for a split-gate non-volatile memory (NVM) cell 400. Similar to embodiment 100 in FIG. 1 (Prior Art) above, the split-gate NVM cell 400 can be implemented to include a semiconductor substrate 112, a drain 136, a source 138, a lightly doped channel region 126, a select gate 116 and a control gate 134. Layer 114 is a select-gate dielectric layer. Layer 128 is a control-gate dielectric layer and also provides a gap dielectric layer between the select gate 116 and the control gate 134. Layer 118 is an antireflective coating (ARC) or other insulating material. And layer 132 is a discrete charge storage layer for the split-gate memory cell. Variations to this split-gate NVM cell 400 could be implemented, as desired.

In one embodiment for the split-gate NVM cell 400, the semiconductor substrate 112 can be a P-type mono-crystalline silicon substrate. Further, the split-gate NVM cell 400 can include an N-type drain 136, an N-type source 138, and a lightly-doped N-type channel region 126. The dielectric layers 114 and 128 can each be silicon oxide layers or other dielectric material. The select gate 116 and the control gate 134 can be conductive materials such as doped polysilicon. The charge storage layer 132 can be a discrete charge storage layer formed using silicon nanocrystals, nitride nanocrystals or some other desired discrete charge storage layer material. Variations could be implemented, as desired.

During operation, selected bias voltages are applied to the split-gate NVM cell 400 depending upon the mode of operation (e.g., program, read, erase). Drain voltage ($V_D$) 102 represents the voltage applied to the drain 136. Source voltage ($V_S$) 104 represents the voltage applied to the source 138. Select-gate voltage ($V_{SG}$) 106 represents the voltage applied to the select gate 116. And control-gate voltage ($V_{CG}$) 108 represents the voltage applied to the control gate 134.

For operation of the split-gate NVM cell 400, charge is either added to or removed from the discrete charge storage layer 132, depending upon whether the cell is desired to be programmed to a logic "1" or left as a logic "0." It is noted that when the cell 400 is programmed, electrons are added to the discrete charge storage layer 132. When the cell 400 is erased, electrons are removed. However, the system may be configured to operate with a weaker erase, if desired, such that after erase, a small negative charge is still left in the discrete charge storage layer 132. Also, the system may be configured to have a very strong erase, such that the discrete charge storage layer 132 is over-erased, generating net holes within the storage layer 132 and thereby providing a positive charge on the storage layer 132 within the erased cell 400. For a read operation of the split-gate NVM cell 400, a determination is made as to whether or not there is a sufficient amount of charge stored within the discrete charge storage layer 132 to qualify as a logic "1."

For an erase operation, the memory system for the split-gate NVM cells 400 can be configured to apply positive bias or negative bias to the control-gate 134. If positive bias is used, the discrete charge storage layer 132 is erased by applying a large positive voltage to the control gate 134 to remove charge through a top-erase process. If negative bias is used, the discrete charge storage layer 132 is erased by applying a large negative voltage to the control gate 134 to remove charge through a bottom-erase process.

During erase operations, it has been determined that high electric fields can occur in region 410 of the split-gate NVM cell 400 due in part to the corner structures within region 410. These high electric fields can cause break-down failures to occur between the select gate 116 and the control gate 134. These break-down failures can cause operational failures for memory systems using split-gate NVM cells 400. It is noted that these corner structures could be rounded using additional processing steps.

As described herein, to reduce these break-down failures, select-gate voltages ($V_{SG}$) 106 are adjusted during erase operations. In particular, an adjusted $V_{SG}$ erase voltage 402 is applied as the select-gate voltage ($V_{SG}$) 106 in order to reduce the electric field formed between the select gate 116 and the control gate 134 during erase operations. Advantageously, therefore, the adjusted $V_{SG}$ erase voltage 402 is adjusted and selected to decrease the voltage difference between the control-gate voltage ($V_{CG}$) 108 and the select-gate voltage ($V_{SG}$) 106 during erase operations, thereby reducing the electric field formed between the control gate 134 and the select gate 116.

Examples are now provided with respect to FIG. 5 and FIG. 6 below for select-gate erase bias voltages that are applied. However, it is noted that variations could be implemented, as desired, while still taking advantage of the adjusted select-gate erase bias voltage techniques described herein for reducing electric fields that can cause break-down failures to occur between the control gate 134 and the select gate 116 during erase operations.

Figure 5:
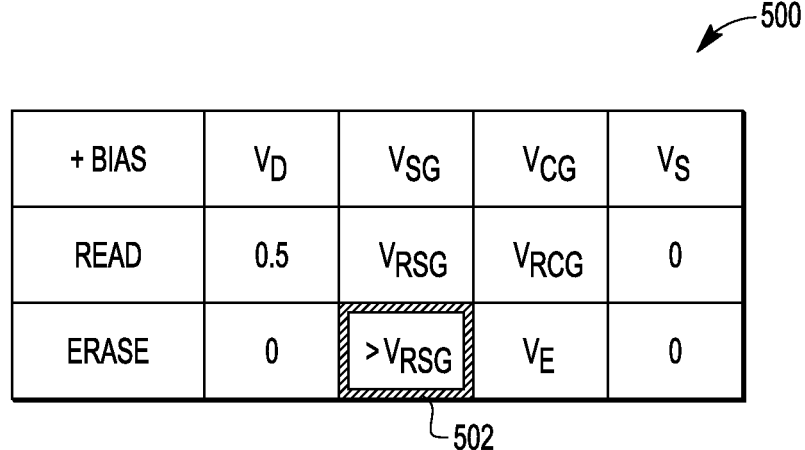
FIG. 5 is a voltage control diagram for read and erase operations for a split-gate NVM cell using an adjusted select-gate erase voltage along with a positive bias (+BIAS).

FIG. 5 is a voltage control diagram 500 for read and erase operations for the split-gate NVM cell 400 using an adjusted select-gate erase voltage along with a positive bias (+BIAS). For the embodiment depicted, the voltages applied during a read operation can be implemented using the same voltages as used for embodiment 200 in FIG. 2 (Prior Art) above. Alternatively, a select-gate read voltage ($V_{RSG}$) can be applied as the select-gate voltage ($V_{SG}$) during read operations that is different from the control-gate read voltage ($V_{RCG}$) applied as the control-gate voltage ($V_{CG}$) during read operations. In contrast with FIG. 2 (Prior Art), during an erase operation, a select-gate bias voltage 502 that is greater than the select-gate read voltage ($V_{RSG}$) is applied as the select-gate voltage ($V_{SG}$), while the control-gate voltage ($V_{CG}$) is still set to a large positive erase voltage ($V_E$). By applying a positive select-gate bias voltage 502 that is greater than the select-gate read voltage ($V_{RSG}$), the electric field in region 410 of the split-gate NVM cell 400 is advantageously reduced.

It is noted that the select-gate voltage ($V_{SG}$) applied during erase operations, if desired, can be set to be greater than the select-gate read voltage ($V_{RSG}$) applied during read operations by 0.5 volts or more. Still further, if desired, the select-gate voltage ($V_{SG}$) applied during erase operations can be set to be greater than the select-gate read voltage ($V_{RSG}$) applied during read operations by 3.0 volts or more. In addition, the select-gate voltage ($V_{SG}$) applied during erase operations can be set to have a magnitude that is less than the magnitude for the erase voltage ($V_E$) applied to the control-gate voltage ($V_{CG}$) by 5.0 volts or more. As a further example, it is noted that 1.2 volts can be selected for the select-gate read voltage level ($V_{RSG}$); 1.5 volts can be applied as the control-gate read voltage level ($V_{RCG}$); and 14 volts can be selected for the erase voltage ($V_E$). As one further example, the control-gate read voltage level ($V_{RCG}$) can be made to be equal to 1.2 volts, as well. As described above, the positive bias voltage 502 applied as the select-gate voltage ($V_{SG}$) during erase operations is configured to be greater than 1.2 volts and could be, for example, an select-gate erase voltage of about 2.0 volts. In another example, the select-gate read voltage level ($V_{RSG}$) can be 3.3 volts; the erase voltage ($V_E$) can be 15 volts; and the select-gate erase voltage can be 5.5 volts. Other variations could also be implemented as desired.

Figure 6:
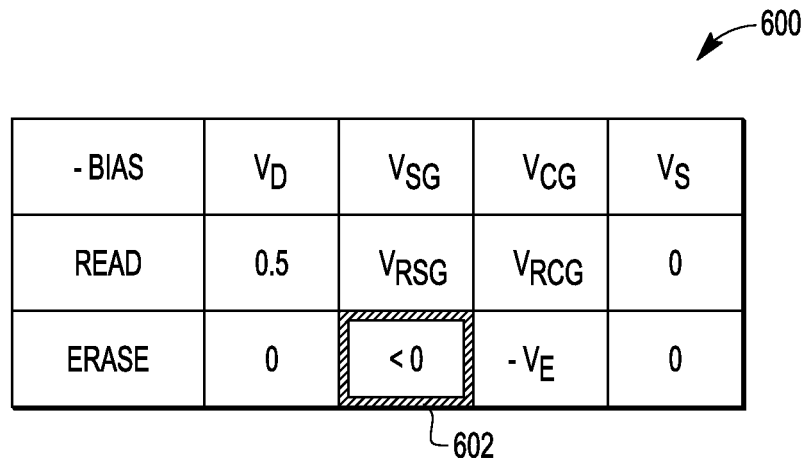
FIG. 6 is a voltage control diagram for read and erase operations for a split-gate NVM cell using an adjusted select-gate erase voltage along with a negative bias (−BIAS).

FIG. 6 is a voltage control diagram 600 for read and erase operations for the split-gate NVM cell 100 using an adjusted select-gate erase voltage along with a negative bias (−BIAS). For the embodiment depicted, the voltages applied during a read operation can be implemented using the same voltages as used for embodiment 300 in FIG. 3 (Prior Art) above. Alternatively, a select-gate read voltage ($V_{RSG}$) can be applied as the select-gate voltage ($V_{SG}$) during read operations that is different from the control-gate read voltage ($V_{RCG}$) applied as the control-gate voltage ($V_{CG}$) during read operations. In contrast with FIG. 2 (Prior Art), during an erase operation, a select-gate bias voltage 602 that is smaller than the select-gate read voltage ($V_{RSG}$) or 0 volts (e.g., ground) is applied as the select-gate voltage ($V_{SG}$), while the control-gate voltage ($V_{CG}$) is still set to a large negative erase voltage ($V_E$). By applying a negative bias voltage 602 that is less than the select-gate read voltage ($V_{RSG}$) or ground voltage, the electric field in region 410 of the split-gate NVM cell 400 is advantageously reduced.

It is noted that the select-gate voltage ($V_{SG}$) applied during erase operations, if desired, can be set to be less than the select-gate read voltage ($V_{RSG}$) applied during read operations by 0.5 volts or more. The voltage level of the select-gate voltage ($V_{SG}$) can also be set to a negative voltage level that has a magnitude that is greater than a magnitude for the select-gate read voltage by 0.5 volts or more. Still further, if desired, the select-gate voltage ($V_{SG}$) applied during erase operations can be set to be less than the select-gate read voltage ($V_{RSG}$) applied during read operations by 3.0 volts or more. The voltage level of the select-gate voltage ($V_{SG}$) can also be set to a negative voltage level that has a magnitude that is greater than a magnitude for the select-gate read voltage by 3.0 volts or more. In addition, the select-gate voltage ($V_{SG}$) applied during erase operations can be set to have a magnitude that is less than the magnitude for the erase voltage ($V_E$) applied to the control-gate voltage ($V_{CG}$) by 5.0 volts or more. As a further example, it is noted that 1.2 volts can be selected for the select-gate read voltage level ($V_{RSG}$); 1.5 volts can be applied for the control-gate read voltage ($V_{RCG}$); and −14 volts can be selected for the erase voltage (−$V_E$). As one further example, the control-gate read voltage level ($V_{RCG}$) can be made to be equal to 1.2 volts, as well. As described above, the negative bias voltage 602 applied as the select-gate voltage ($V_{SG}$) during erase operations is configured to be less than 0 volts (e.g., ground) and could be, for example, an select-gate erase voltage of about −0.5 volts. In another example, the select-gate read voltage level ($V_{RSG}$) can be 1.2 volts; the erase voltage (−$V_E$) can be −14 volts; and the select-gate erase voltage can be −1.2 volts. In a further example, the select-gate read voltage level ($V_{RSG}$) can be 1.2 volts; the erase voltage (−$V_E$) can be −14 volts; and the select-gate erase voltage can be −2.0 volts. In a still further example, the select-gate read voltage level ($V_{RSG}$) can be 3.3 volts; the erase voltage (−$V_E$) can be −15 volts; and the select-gate erase voltage can be −3.3 volts. Other variations could also be implemented as desired.

Figure 7:
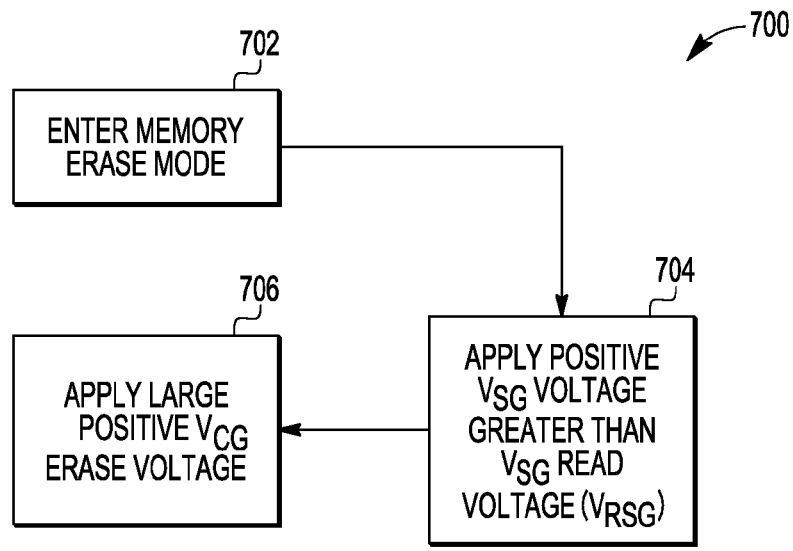
FIG. 7 is a process flow diagram of an embodiment for erase operations for a split-gate NVM cell using an adjusted select-gate erase voltage along with a positive bias (+BIAS).

FIG. 7 is a process flow diagram of an embodiment 700 for erase operations for the split-gate NVM cell 400 using an adjusted select-gate erase voltage along with a positive bias (+BIAS). First, in block 702, the memory erase mode of operation is entered. Next, in block 704, a positive select-gate voltage ($V_{SG}$) is applied that is greater than the select-gate voltage used for the read operation ($V_{RSG}$). Finally, in block 706, a large positive voltage is applied to the control-gate ($V_{CG}$) in order to erase selected split-gate NVM cells.

Figure 8:
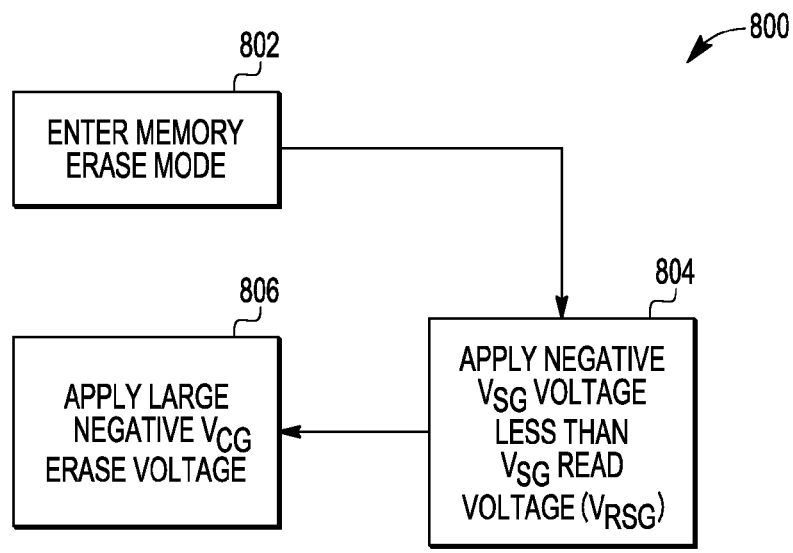
FIG. 8 is a process flow diagram of an embodiment for erase operations for a split-gate NVM cell using an adjusted select-gate erase voltage along with a negative bias (−BIAS).

FIG. 8 is a process flow diagram of an embodiment 800 for erase operations for the split-gate NVM cell 400 using an adjusted select-gate erase voltage along with a negative bias (−BIAS). First, in block 802, the memory erase mode of operation is entered. Next, in block 804, a negative select-gate voltage ($V_{SG}$) is applied that is less than 0 volts (e.g., ground) and less than the select-gate voltage used for the read operation ($V_{RSG}$). Finally, in block 706, a large negative voltage is applied to the control-gate ($V_{CG}$) in order to erase selected split-gate NVM cells.

Figure 9:
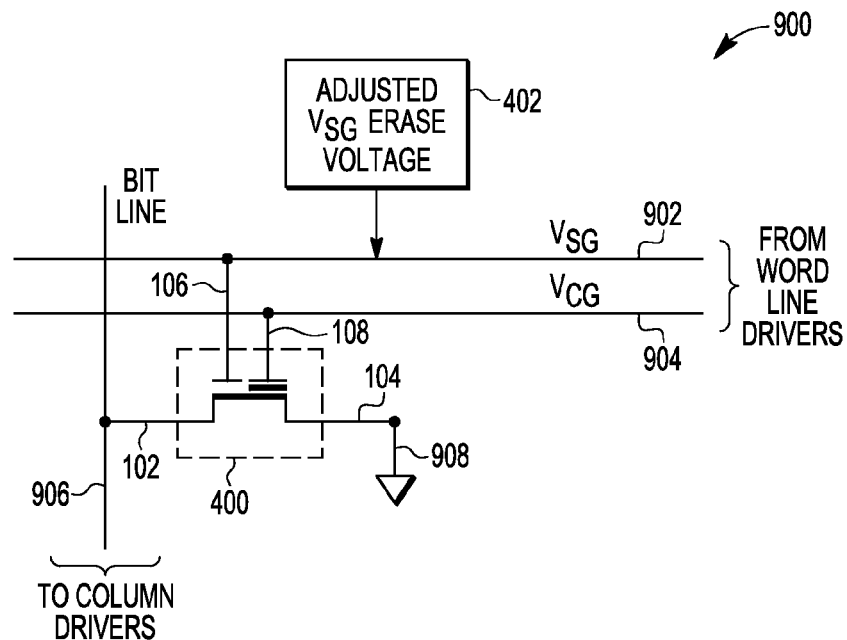
FIG. 9 is a diagram of an embodiment for wordline and column driver connections associated with a split-gate NVM cell where an adjusted select-gate erase voltage is applied to reduce break-down failures.

FIG. 9 is a diagram of an embodiment 900 for wordline and column driver connections associated with a split-gate NVM cells 400 where an adjusted select-gate erase voltage is applied to reduce break-down failures. For the embodiment depicted, the source voltage ($V_S$) 104 is provided by a connection to ground 908. The drain voltage ($V_D$) 102 is provided by a connection to the column line 906, which is coupled to column drivers for the memory array. The control gate voltage ($V_{CG}$) 108 is provided by a connection to a first wordline 904, which is coupled to wordline drivers for the memory array. And the select-gate voltage ($V_{SG}$) 106 is provided by a connection to a second wordline 902, which is also coupled to wordline drivers for the memory array. As described herein, an adjusted $V_{SG}$ erase voltage 402 is applied to the wordline 902 during erase operations to reduce break-down failures due to high electric fields in region 410 for the split-gate NVM cell 400.

Figure 10:
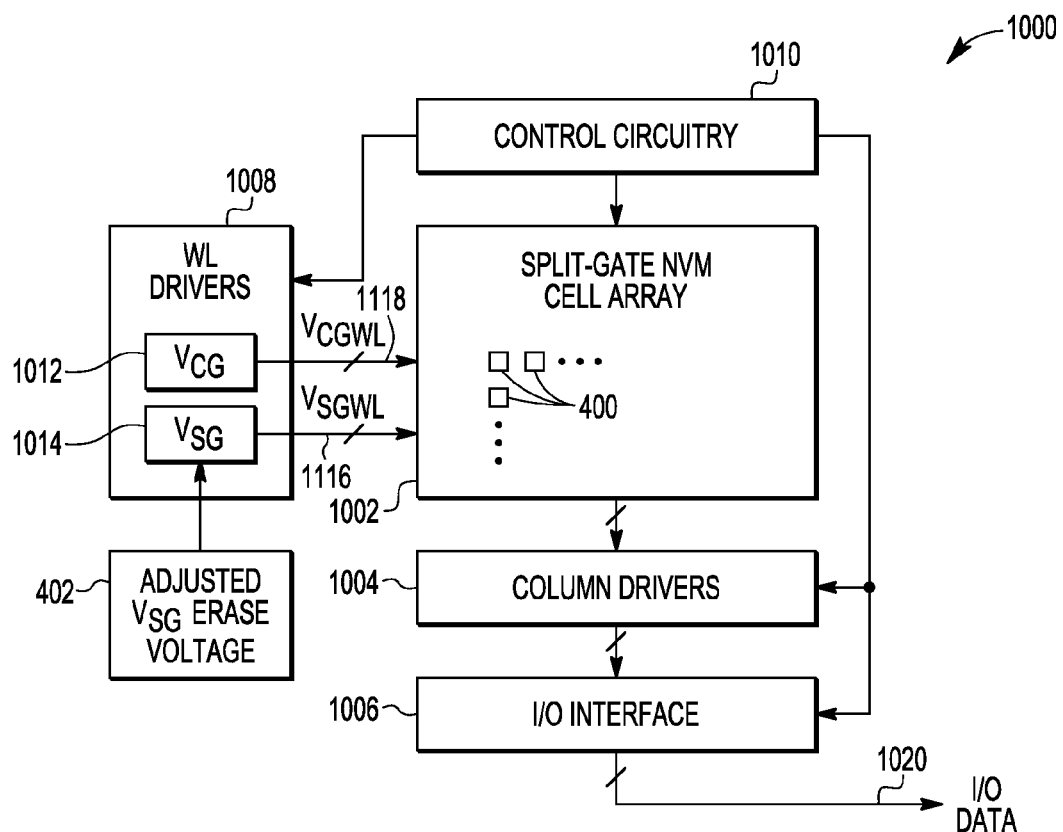
FIG. 10 is a block diagram of an embodiment for a split-gate NVM system including a memory cell array having a plurality of split-gate NVM cells where an adjusted select-gate erase voltage is applied to reduce break-down failures.

FIG. 10 is a block diagram of an embodiment for a split-gate NVM system 1000 including a memory cell array 1002 having a plurality of split-gate NVM cells 400. The split-gate NVM cell array 1002 is coupled to wordline (WL) driver circuitry 1008, which include control-gate ($V_{CG}$) driver circuitry 1012 and select-gate ($V_{SG}$) driver circuitry 1014. In operation, the wordline (WL) driver circuitry 1008 applies appropriate select-gate wordline bias voltages ($V_{SGWL}$) 1116 and control-gate wordline bias voltages ($V_{CGWL}$) 1118 to the wordline connections for selected rows of the split-gate NVM cell array 1002. The split-gate NVM cell array 1002 is also coupled to column driver circuitry 1004. For read operations, the column driver circuitry 1004 receives column data from the split-gate NVM cell array 1002 and outputs selected portions of this data to an input/output (I/O) interface 1006. Control circuitry 1010 is coupled to and provides control signals to the wordline (WL) driver circuitry 1008, the column driver circuitry 1004 and the I/O interface 1006. It is noted that the wordline driver circuitry 1008 can be configured to receive a plurality of different supply voltage inputs that can be selected to provide the select-gate and control-gate wordline voltages. It is further noted that, the input/output (I/O) output data channel 102 coupled to the I/O interface 1006 can be used internally within an integrated circuit or can be communicated externally from the integrated circuit within which the split-gate NVM system 1000 is integrated, as desired.

It is again noted that the split-gate NVM system 1000 can be configured to use a positive bias erase technique, or the split-gate NVM system 1000 can be configured to use a negative bias erase technique. While both techniques could be implemented in the same memory system, memory systems are more typically implemented to use one technique or the other, but not both.

For a positive bias erase implementation, the control-gate driver circuitry 1012 is configured to apply a large positive voltage during erase operations. According to the adjusted select-gate erase voltage techniques described herein, the select-gate driver circuitry 1014 is configured to apply a positive select-gate bias voltage ($V_{SG}$) that is greater than the select-gate read voltage ($V_{RSG}$) applied by the select-gate driver circuitry 1014 during read operations. As described above, if desired, the select-gate voltage ($V_{SG}$) applied by the select-gate driver circuitry 1014 during erase operations can be set to be greater than the select-gate read voltage ($V_{RSG}$) applied by the select-gate driver circuitry 1014 during read operations by 0.5 volts or more. Still further, if desired, the select-gate voltage ($V_{SG}$) applied by the select-gate driver circuitry 1014 during erase operations can be set to be greater than the select-gate read voltage ($V_{RSG}$) applied by the select-gate driver circuitry 1014 during read operations by 3.0 volts or more. For certain embodiments, it is noted that the select-gate read voltage ($V_{RSG}$) applied by the select-gate driver circuitry during read operations can be ground (e.g., 0 volts) for the split-gate NVM system 1000 or can be a supply voltage ($V_{DD}$) for the split-gate NVM system 1000. Other variations could also be used for the applied voltages, as desired, depending upon the operational objections for the split-gate NVM system utilized.

For a negative bias erase implementation, the control-gate driver circuitry 1012 is configured to apply a large negative voltage during erase operations. According to the adjusted select-gate erase voltage techniques described herein, the select-gate driver circuitry 1014 is configured to apply a negative select-gate bias voltage ($V_{SG}$) that is less than the select-gate read voltage ($V_{RSG}$) applied by the select-gate driver circuitry 1014 during read operations. As described above, if desired, the select-gate voltage ($V_{SG}$) applied by the select-gate driver circuitry 1014 during erase operations can be set to be less than the select-gate read voltage ($V_{RSG}$) applied by the select-gate driver circuitry 1014 during read operations by 0.5 volts or more. The voltage level of the select-gate voltage ($V_{SG}$) can also be set to a negative voltage level that has a magnitude that is greater than a magnitude for the select-gate read voltage by 0.5 volts or more. Still further, if desired, the select-gate voltage ($V_{SG}$) applied by the select-gate driver circuitry 1014 during erase operations can be set to be less than the select-gate read voltage ($V_{RSG}$) applied by the select-gate driver circuitry 1014 during read operations by 3.0 volts or more. The voltage level of the select-gate voltage ($V_{SG}$) can also be set to a negative voltage level that has a magnitude that is greater than a magnitude for the select-gate read voltage by 3.0 volts or more. For certain embodiments, it is noted that the select-gate read voltage ($V_{RSG}$) applied by the select-gate driver circuitry during read operations can be ground (e.g., 0 volts) for the split-gate NVM system 1000 or can be a supply voltage ($V_{DD}$) for the split-gate NVM system 1000. Other variations could also be used for the applied voltages, as desired, depending upon the operational objections for the split-gate NVM system utilized.

It is noted that a positive voltage as used herein is one that is greater than ground (e.g., 0 volts) for the split-gate NVM system 1000. And a negative voltage as used herein is one that is less than ground (e.g., 0 volts) for the split-gate NVM system 1000. It is further noted that an erase voltage bias of greater than 5.0 volts (e.g., for positive erase) or less then 5.0 volts (e.g., for negative erase) as compared to ground for the select-gate voltage ($V_{SG}$) may lead to undesirable disturbances within the split-gate NVM cells.

It is further noted that the semiconductor substrates described herein can be any semiconductor material or combinations of materials, such as gallium arsenide, silicon germanium, silicon-on-insulator (SOI), silicon, monocrystalline silicon, the like, and combinations of the above. It is also noted that the semiconductor substrate 112 represents the top portion of a semiconductor substrate. It is further noted that the semiconductor substrate for the split-gate non-volatile memory (NVM) cells described herein could be formed on top of other substrate materials including a separate non-semiconductor material, if desired, such as to form thin film semiconductor substrates on other semiconductor or non-semiconductor materials. Other variations could also be implemented, as desired.

It is also noted that split-gate NVM cells are typically operated with high electric fields between the control gate 134 and the select gate 116 to enhance erase speed, and a reduction to this electric field is typically avoided. The embodiments described herein, however, achieve improved performance by applying adjusted select-gate erase bias voltages to the select gate 116 during erase operations that reduce the electric field formed between the control gate 134 and the select gate 116 during erase operations. It has been found that this reduction in electric field does not degrade erase speed performance as significantly as would be expected, particularly where a discrete charge storage layer is used as the storage layer 132 for the split-gate NVM cells 400. For example, where silicon nanocrystal structures are used within the discrete charge storage layer 132, these nanocrystals mitigate the negative impact to erase speed caused by the reduction in the electric field between the control gate 134 and the select gate 116 during erase operations. In part, these nanocrystal split-gate structures allow adjusted select-gate bias voltages as described herein because these structures have low lateral charge leakage. In contrast, for example, with floating gate split-gate structures where floating gates are used as the NVM storage layer, the floating gates can be disturbed by the adjusted select-gate bias voltages because these floating gate structures have higher lateral charge leakage than due the discrete charge storage structures. It is noted that the adjusted select-gate bias voltage techniques described herein could provide other advantages, as well, and the discussion of these advantages should not be seen as limiting the scope of the present invention.

As described herein, a variety of embodiments can be implemented and different features and variations can be implemented, as desired.

Embodiments are described herein for a split-gate non-volatile memory (NVM) system, including a plurality of split-gate non-volatile memory (NVM) cells, a control gate driver circuitry, and a select gate driver circuitry. The split-gate NVM cells each include a select gate, a control gate, and a discrete charge storage layer. The control gate driver circuitry is configured to provide at least one of a positive control-gate erase voltage or a negative control-gate erase voltage to the control gates during erase operations. The select gate driver circuitry is configured to provide a select-gate read voltage to the select gates during read operations and configured to provide a select-gate erase voltage to the select gates during erase operations. The select-gate erase voltage is a positive voltage that is greater than the select-gate read voltage if the control gate driver circuitry is configured to provide a positive control-gate erase voltage, and the select-gate erase voltage is a negative voltage that is less than the select-gate read voltage if the control gate driver circuitry is configured to provide a negative control-gate erase voltage. In further described embodiments, the discrete charge storage layer includes silicon nanocrystals. And still further, the magnitude of the select-gate erase voltage can be configured to be less than the magnitude of the control-gate erase voltage by 5.0 volts or more.

Embodiments are further described where the control gate driver circuitry is configured to apply only a positive control-gate erase voltage. For these embodiments, the select-gate driver can be further configured to apply the positive select-gate erase voltage at a voltage level that is greater than the select-gate read voltage by 0.5 volts or more. Still further, the select-gate driver can be configured to apply the positive select-gate erase voltage at a voltage level that is greater than the select-gate read voltage by 3.0 volts or more Embodiments are also described where the control gate driver circuitry is configured to apply only a negative control-gate erase voltage. For these embodiments, the select-gate driver can be further configured to apply the negative select-gate erase voltage at a negative voltage level that has a magnitude that is greater than a magnitude for the select-gate read voltage by 0.5 volts or more. Still further, the select-gate driver can be further configured to apply the negative select-gate erase voltage at a negative voltage level that has a magnitude that is greater than a magnitude for the select-gate read voltage by 3.0 volts or more Still further, each of the split-gate NVM cells can be further configured to include a gap dielectric layer positioned between the select gate and the control gate, and a control gate dielectric layer positioned between the control gate and a substrate, such that a thickness for the gap dielectric layer is dependent upon a thickness for the control gate dielectric layer.

Methods for erasing a split-gate non-volatile memory (NVM) system are also described herein that include providing a plurality of split-gate non-volatile memory (NVM) cells that include a select gate, a control gate, and a discrete charge storage layer; applying at least one of a positive control-gate erase voltage to the control gates or applying a negative control-gate erase voltage to control gates; and applying a select-gate erase voltage to the select gates that is different from a select-gate read voltage applied to the select gates during read operations. The select-gate erase voltage is a positive voltage that is greater than the select-gate read voltage if a positive control-gate erase voltage. The select-gate erase voltage is a negative voltage that is less than the select-gate read voltage if a negative control-gate erase voltage. In further described embodiments, the method can include using silicon nanocrystals as the discrete charge storage layer. And still further, the magnitude of the select-gate erase voltage can be configured to be less than the magnitude of the control-gate erase voltage by 5.0 volts or more.

Embodiments are further describe where the applying steps include applying only a positive control-gate erase voltage to the control gates. For these embodiments, the positive select-gate erase voltage can be applied at a voltage level that is greater than the select-gate read voltage by 0.5 volts or more. Still further, the positive select-gate erase voltage can be applied at a voltage level that is greater than the select-gate read voltage by 3.0 volts or more.

Embodiments are also described where the applying steps include applying only a negative control-gate erase voltage to the control gates. For these embodiments, the negative select-gate erase voltage can be applied at a negative voltage level that has a magnitude that is greater than a magnitude for the select-gate read voltage by 0.5 volts or more. Still further, the negative select-gate erase voltage can be applied at a negative voltage level that has a magnitude that is greater than a magnitude for the select-gate read voltage by 3.0 volts or more.

Still further, embodiments are described where each split-gate NVM cell further includes a gap dielectric layer positioned between the select gate and the control gate, and a control gate dielectric layer positioned between the control gate and a substrate, such that a thickness for the gap dielectric layer is dependent upon a thickness for the control gate dielectric layer.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A split-gate non-volatile memory (NVM) system, comprising:
    a plurality of split-gate non-volatile memory (NVM) cells, each split-gate NVM cell comprising:
        a select gate;
        a control gate; and
        a discrete charge storage layer;
    control gate driver circuitry configured to provide at least one of a positive control-gate erase voltage or a negative control-gate erase voltage to the control gates during erase operations; and
    select gate driver circuitry configured to provide a select-gate read voltage to the select gates during read operations and configured to provide a select-gate erase voltage to the select gates during erase operations, wherein the select-gate erase voltage is a positive voltage that is greater than the select-gate read voltage if the control gate driver circuitry is configured to provide a positive control-gate erase voltage, and wherein the select-gate erase voltage is a negative voltage that is less than the select-gate read voltage if the control gate driver circuitry is configured to provide a negative control-gate erase voltage.

2. The split-gate non-volatile memory (NVM) system of claim 1, wherein the discrete charge storage layer comprises silicon nanocrystals.

3. The split-gate non-volatile memory (NVM) system of claim 1, wherein the magnitude of the select-gate erase voltage is less than the magnitude of the control-gate erase voltage by 5.0 volts or more.

4. The split-gate non-volatile memory (NVM) system of claim 1, wherein the control gate driver circuitry is configured to apply only a positive control-gate erase voltage.

5. The split-gate non-volatile memory (NVM) system of claim 4, wherein the select-gate driver is configured to apply the positive select-gate erase voltage at a voltage level that is greater than the select-gate read voltage by 0.5 volts or more.

6. The split-gate non-volatile memory (NVM) system of claim 4, wherein the select-gate driver is configured to apply the positive select-gate erase voltage at a voltage level that is greater than the select-gate read voltage by 3.0 volts or more.

7. The split-gate non-volatile memory (NVM) system of claim 1, wherein the control gate driver circuitry is configured to apply only a negative control-gate erase voltage.

8. The split-gate non-volatile memory (NVM) system of claim 7, wherein the select-gate driver is configured to apply the negative select-gate erase voltage at a negative voltage level that has a magnitude that is greater than a magnitude for the select-gate read voltage by 0.5 volts or more.

9. The split-gate non-volatile memory (NVM) system of claim 7, wherein the select-gate driver is configured to apply the negative select-gate erase voltage at a negative voltage level that has a magnitude that is greater than a magnitude for the select-gate read voltage by 3.0 volts or more.

10. The split-gate non-volatile memory (NVM) system of claim 1, further comprising column driver circuitry configured to receive data from one or more of the split-gate NVM cells during a read operation.

11. A method for erasing a split-gate non-volatile memory (NVM) system, comprising:
 providing a plurality of split-gate non-volatile memory (NVM) cells, each split-gate NVM cell comprising:
  a select gate;
  a control gate; and
  a discrete charge storage layer;
 during an erase operation, applying at least one of a positive control-gate erase voltage to the control gates or a negative control-gate erase voltage to the control gates; and
 also during the erase operation, applying a select-gate erase voltage to the select gates, the select-gate erase voltage being different from a select-gate read voltage applied to the select gates during read operations, wherein the select-gate erase voltage is a positive voltage that is greater than the select-gate read voltage if a positive control-gate erase voltage is applied, and wherein the select-gate erase voltage is a negative voltage that is less than the select-gate read voltage if a negative control-gate erase voltage is applied.

12. The method of claim 11, using silicon nanocrystals as the discrete charge storage layer.

13. The method of claim 11, further comprising applying a select-gate erase voltage having a magnitude that is less than the magnitude of the control-gate erase voltage by 5.0 volts or more.

14. The method of claim 11, wherein the applying steps comprise applying only a positive control-gate erase voltage to the control gates.

15. The method of claim 14, further comprising applying the positive select-gate erase voltage at a voltage level that is greater than the select-gate read voltage by 0.5 volts or more.

16. The method of claim 14, further comprising applying the positive select-gate erase voltage at a voltage level that is greater than the select-gate read voltage by 3.0 volts or more.

17. The method of claim 11, wherein the applying steps comprise applying only a negative control-gate erase voltage to the control gates.

18. The method of claim 17, further comprising applying the negative select-gate erase voltage at a negative voltage level that has a magnitude that is greater than a magnitude for the select-gate read voltage by 0.5 volts or more.

19. The method of claim 17, further comprising applying the negative select-gate erase voltage at a negative voltage level that has a magnitude that is greater than a magnitude for the select-gate read voltage by 3.0 volts or more.

20. The method of claim 11, further comprising receiving data from one or more of the split-gate NVM cells during a read operation.

* * * * *